(12) United States Patent
Kim et al.

(10) Patent No.: US 6,579,757 B2
(45) Date of Patent: Jun. 17, 2003

(54) METHOD FOR FABRICATING SEMICONDUCTOR DEVICE WHICH PREVENTS GATES OF A PERIPHERAL REGION FROM BEING OXIDIZED

(75) Inventors: Jae Hyung Kim, Chungchongbuk-do (KR); Sang Gi Ko, Chungchongbuk-do (KR); Byoung Ock Song, Chungchongbuk-do (KR); Hee Joong Oh, Chungchongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/989,489

(22) Filed: Nov. 21, 2001

(65) Prior Publication Data

US 2002/0061616 A1 May 23, 2002

(30) Foreign Application Priority Data

Nov. 22, 2000 (KR) ........................... 2000-69659

(51) Int. Cl.⁷ .......................................... H01L 21/8242
(52) U.S. Cl. ...................................... 438/241; 438/258
(58) Field of Search ................. 438/157, 195, 438/200, 239, 241, 258, 303, 587, 626

(56) References Cited

U.S. PATENT DOCUMENTS

| | | | | |
|---|---|---|---|---|
| 5,858,831 A | * | 1/1999 | Sung ........................... | 438/241 |
| 5,893,737 A | | 4/1999 | Takahi et al. ................ | 438/275 |
| 6,025,623 A | * | 2/2000 | Sunouchi et al. ........... | 257/304 |
| 6,387,759 B1 | * | 5/2002 | Park et al. ................... | 438/275 |
| 6,391,736 B1 | * | 5/2002 | Uh et al. ..................... | 438/396 |
| 6,486,023 B1 | * | 11/2002 | Nagata ........................ | 438/241 |

* cited by examiner

*Primary Examiner*—Wael Fahm, Jr.
*Assistant Examiner*—Hoai Pham
(74) *Attorney, Agent, or Firm*—Birch, Stewart, Kolasch & Birch, LLP

(57) ABSTRACT

A method of fabricating a semiconductor device, includes the steps of forming gates in a cell region and in a peripheral region of a substrate, forming a polysilicon layer over an entire surface of the resultant structure, partially removing portions of the polysilicon layer in the cell region to maintain the polysilicon layer of a predetermined thickness in the cell region, removing the predetermined thickness of the polysilicon layer both in the cell and peripheral regions, so that the resultant structure includes exposed gates in the cell region but no exposed gates in the peripheral region, and forming an insulating layer over the resultant structure.

19 Claims, 4 Drawing Sheets

METHOD FOR FABRICATING SEMICONDUCTOR DEVICE WHICH PREVENTS GATES OF A PERIPHERAL REGION FROM BEING OXIDIZED

RELATED APPLICATION

The present application claims the benefit of Korean Patent Application No. P2000-69659, filed Nov. 22, 2000, which is herein fully incorporated by reference.

BACKGROUND OF THE INVENTION

1. Field of the Invention

The present invention relates to a semiconductor device, and more particularly, to a method for fabricating a semiconductor device which prevents a poor gate of a peripheral region that may be generated due to a difference of pattern density between a cell region and the peripheral region in a memory device.

2. Discussion of the Related Art

A related art method for fabricating a semiconductor device will be described with reference to the accompanying drawings.

FIGS. 1A to 1G are sectional views showing related art process steps of fabricating a capacitor of a semiconductor device.

As shown in FIG. 1A, a field oxide film 12 is formed in a predetermined region of a semiconductor substrate 11 to define an active region.

Then, a gate oxide film (not shown) is formed on the entire surface of the semiconductor substrate 11. A first polysilicon film 13, a tungsten film 14, a silicon nitride film 15, and a cap oxide film 16 are sequentially deposited on the gate oxide film. The cap oxide film 16, the silicon nitride film 15, the tungsten film 14, and the first polysilicon film 13 are selectively removed by photolithography and etching processes to form a plurality of gates 17 in a cell region and a peripheral region. At this time, the density of the gates 17 formed in the cell region is higher than the density of the gates formed in the peripheral region.

A first oxide film 18 is then deposited on the entire surface of the semiconductor substrate 11, and a first photoresist (not shown) is deposited on the entire surface of the resultant structure. Subsequently, the first photoresist is patterned by exposure and developing processes to expose the first oxide film 18 of the cell region. The exposed first oxide film 18 of the cell region is etched back using the patterned first photoresist as a mask to form insulating film spacers 19 at both sides of each of the gates 17.

As shown in FIG. 1B, a second polysilicon film 20 of a predetermined thickness is then deposited on the entire surface of the semiconductor substrate 11. At this time, a step difference occurs between the second polysilicon film 20 formed in the cell region and the second polysilicon film 20 formed in the peripheral region due to the density difference between the gates 17 formed in the cell region and the gates 17 formed in the peripheral region. In other words, the top surface of the second polysilicon film 20 of the cell region having a higher pattern density (e.g., gates 17 are less spread out) is positioned to be higher than the second polysilicon film 20 of the peripheral region having a lower pattern density.

As shown in FIG. 1C, a second photoresist 21 is then deposited on the semiconductor substrate 11 and then selectively patterned by exposure and developing processes to remain only in the peripheral region. Subsequently, the second polysilicon film 20 of the cell region is partially removed to have the same height as the second polysilicon film 20 of the peripheral region using the patterned second photoresist 21 as a mask. Then, the second photoresist 21 is removed completely.

As shown in FIG. 1D, a chemical mechanical polishing (CMP) process is performed on the entire surface to remove portions of the second polysilicon film 20, so that the cap oxide film 16 of the gates 17 both in the cell and peripheral regions is exposed and a flat top surface is provided for the entire structure.

To define a plug region which will be used in the cell region, as shown in FIG. 1E, a second oxide film 22 is deposited on the entire surface of the semiconductor substrate 11.

Subsequently, a third photoresist 23 is deposited on the semiconductor substrate 11 and then patterned by the exposure and developing processes to remain only over the semiconductor substrate 11 of the cell region.

As shown in FIG. 1F, the second oxide film 22 of the peripheral region is removed using the patterned third photoresist 23 as a mask to form a masking film 22a only in the cell region. However, the second oxide film 22 of the peripheral region and the cap oxide film 16 below the second oxide film 22 are formed of the same material. Accordingly, the cap oxide film 16 of the peripheral region is partially removed during the process for removing the second oxide film 22 in the peripheral region. The third photoresist 23 is then removed.

The second polysilicon film 20 of the peripheral region is then removed using the masking film 22a as a mask. At this time, however, the remaining cap oxide film 16 or a portion thereof in the peripheral region is also removed during this process. The silicon nitride film 15 is then removed to expose the tungsten film 14.

Thus, the aforementioned related art method for fabricating a semiconductor device has at least several problems.

The metal portions of the gates 17 in the peripheral region are exposed as the cap insulating film (cap oxide film and silicon nitride film) in the peripheral region is lost during the etching process. The exposed metal portions of the gates are oxidized due to an annealing process performed in the subsequent process of forming a capacitor of a memory device, which increase the resistivity of the gates significantly. This problem then reduces an operational speed of the device and its reliability.

SUMMARY OF THE INVENTION

Accordingly, the present invention is directed to a method for fabricating a semiconductor device that substantially obviates one or more of the problems due to limitations and disadvantages of the related art.

An object of the present invention is to provide a method for fabricating a semiconductor device which prevents gates of a peripheral region from being oxidized, so as to improve the reliability and performance characteristics of the device.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve these and other advantages and in accordance with the purpose of the present invention, as embodied and broadly described, a method of fabricating a semiconductor device according to an embodiment of the present invention includes the steps of: forming a plurality of stack gates on a semiconductor substrate in a cell region and a peripheral region; depositing a first insulating film on an entire surface of the semiconductor substrate; selectively removing the first insulating film formed in the cell region to form insulating film spacers at both sides of the gates formed in the cell region; depositing a polysilicon film on the entire surface of the semiconductor substrate, partially removing the polysilicon film formed in the cell region by an etching process using a mask for exposing the cell region to be lower than the polysilicon film formed in the cell region by a predetermined size; exposing a surface of the gates formed in the cell region by performing a planarizing process on the entire surface; forming a masking film on the semiconductor substrate of the cell region; and removing the polysilicon film of the peripheral region using the masking film as a mask.

According to another aspect of the present invention, a method of fabricating a semiconductor device, includes the steps of forming a plurality of stack gates on a semiconductor substrate in a cell region and a peripheral region, forming a first insulating film over the semiconductor substrate, selectively removing the first insulating film formed in the cell region to form insulating film spacers at sides of the gates formed in the cell region, forming a polysilicon film over an entire surface of the semiconductor substrate, partially removing the polysilicon film formed in the cell region by a removal process using a mask for exposing the cell region, so that a top surface of the polysilicon film in the cell region is positioned lower than a top surface the polysilicon film formed in the peripheral region, exposing a surface of the gates formed in the cell region by performing a planarizing process on an entire surface of the resultant structure in the cell and peripheral regions, forming a masking film over the semiconductor substrate of the cell region, and removing the polysilicon film of the peripheral region using the masking film as a mask.

According to still another aspect of the present invention, a method of fabricating a semiconductor device, includes the steps of forming gates in a cell region and in a peripheral region of a substrate, forming a polysilicon layer over an entire surface of the resultant structure, partially removing portions of the polysilicon layer in the cell region to maintain the polysilicon layer of a predetermined thickness in the cell region, removing the predetermined thickness of the polysilicon layer both in the cell and peripheral regions, so that the resultant structure includes exposed gates in the cell region but no exposed gates in the peripheral region, and forming an insulating layer over the resultant structure.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

FIGS. 2A to 2G are sectional views of process steps showing a method for fabricating a semiconductor device according to an embodiment of the present invention.

Figure 1A:
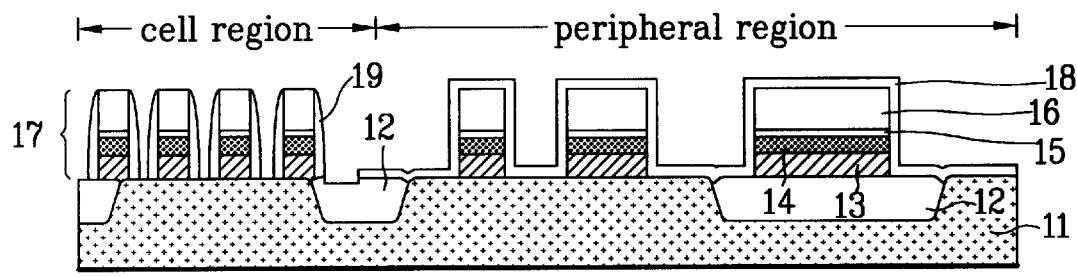
FIGS. 1A to 1G are sectional views of process steps showing a related art method for fabricating a semiconductor device.
Figure 1B:
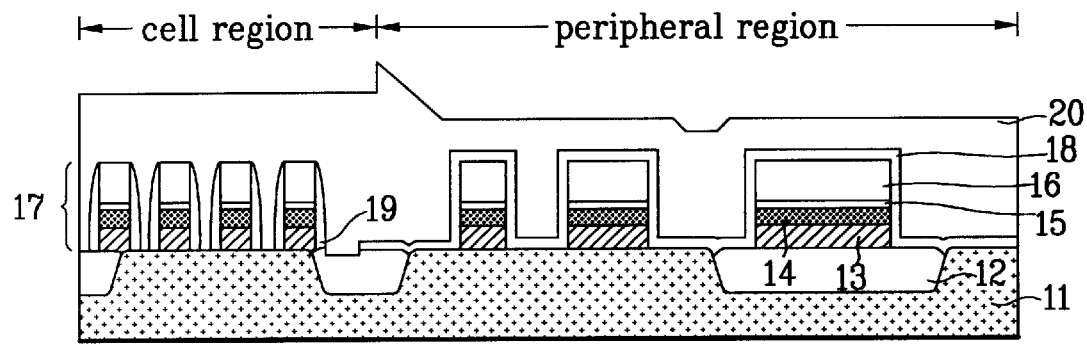
Figure 1C:
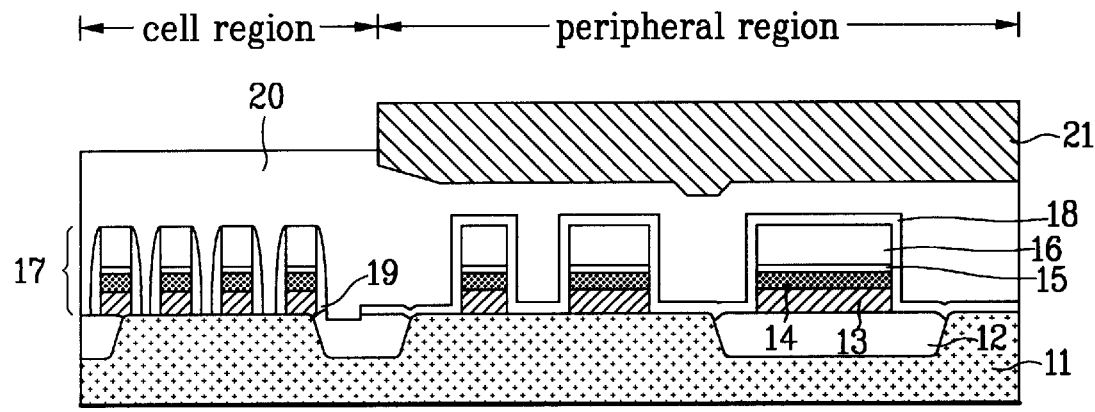
Figure 1D:
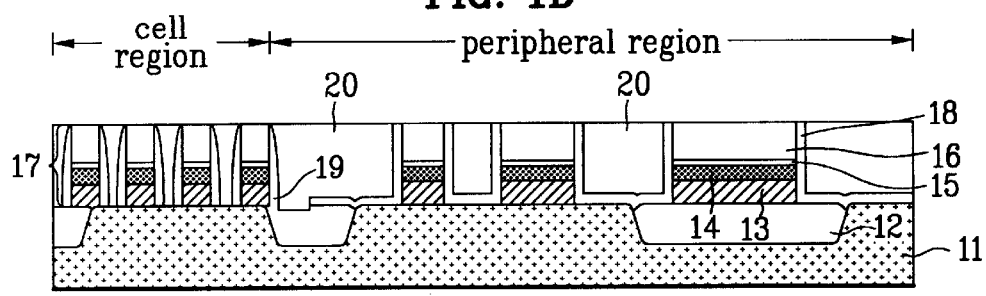
Figure 1E:
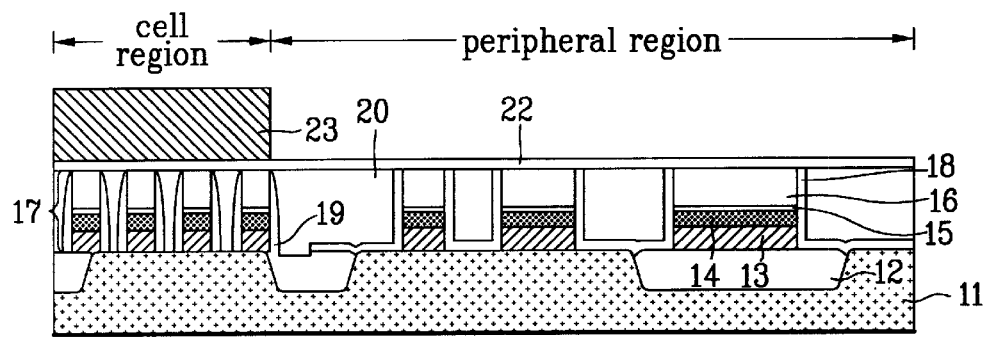
Figure 1F:
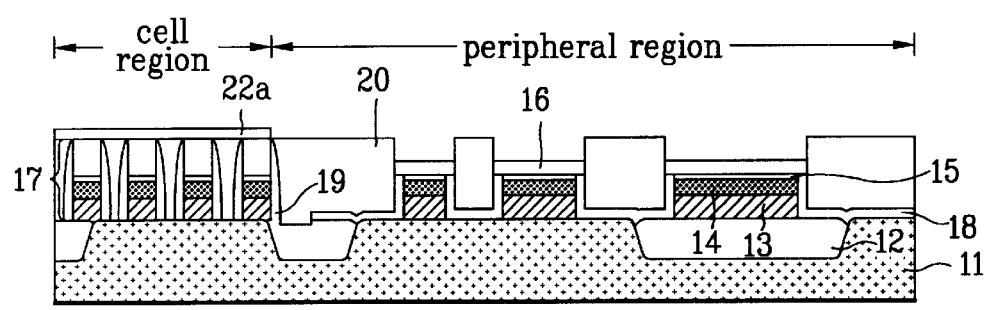
Figure 1G:
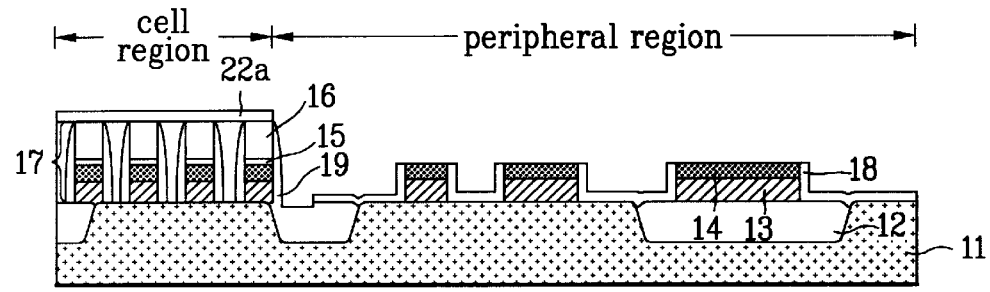
Figure 2A:
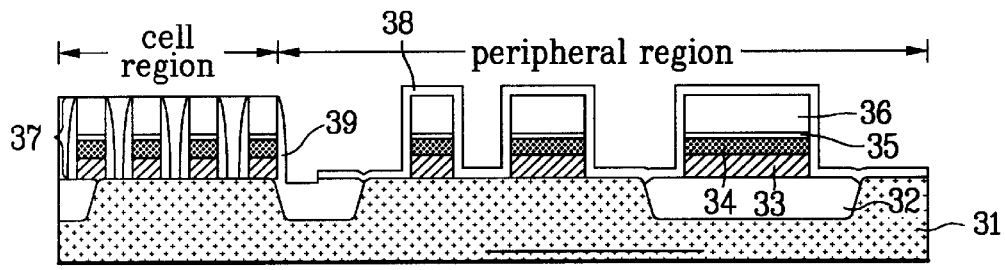
FIGS. 2A to 2G are sectional views of process steps showing a method for fabricating a semiconductor device according to an embodiment of the present invention.

As shown in FIG. 2A, a field oxide film 32 is formed in a predetermined region of a semiconductor substrate 31 to define an active region.

A gate oxide film (not shown) is then formed on the entire surface of the semiconductor substrate 31. A first polysilicon film 33, a tungsten or metal film 34, a silicon nitride film 35, and a cap oxide film 36 are sequentially deposited on the gate oxide film. The cap oxide film 36, the silicon nitride film 35, the tungsten film 34, and the first polysilicon film 33 are then selectively removed by photolithography and etching processes to form a plurality of gates 37 in the cell region and the peripheral region. Here, the density of the gates 37 formed on the semiconductor substrate 31 in the cell region is higher than the density of the gates 37 formed on the semiconductor substrate 31 in the peripheral region.

A first oxide film 38 is then deposited over the entire surface of the semiconductor substrate 31, and a first photoresist (not shown) is deposited on the entire surface of the resultant structure. Subsequently, the first photoresist is patterned by exposure and developing processes or other techniques to remain only in the peripheral region.

The first oxide film 38 of the cell region is then etched back using the patterned first photoresist as a mask to form insulating film spacers 39 at both sides of each of the gates 37 in the cell region.

Figure 2B:
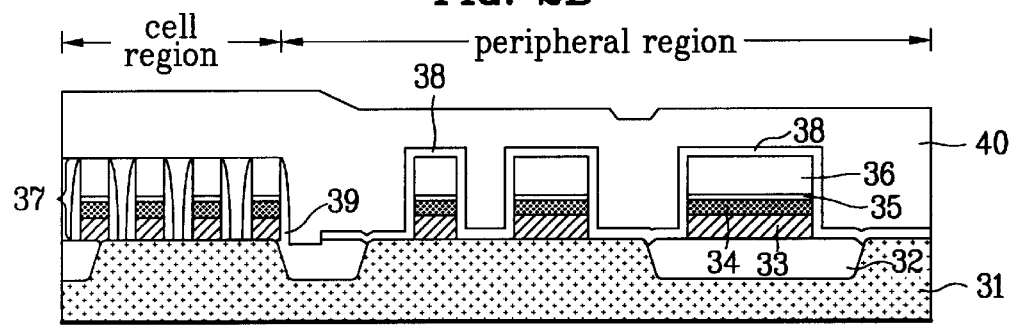

As shown in FIG. 2B, a second polysilicon film 40 of a predetermined thickness is then deposited over the entire surface of the semiconductor substrate 31. Here, a step difference occurs in the second polysilicon film 40 due to the density difference between the gates 37 formed in the cell region and the gates 37 formed in the peripheral region. In other words, the top surface of the second polysilicon film 40 formed in the peripheral region is positioned to be lower than the top surface of the second polysilicon film 40 formed in the cell region.

Figure 2C:
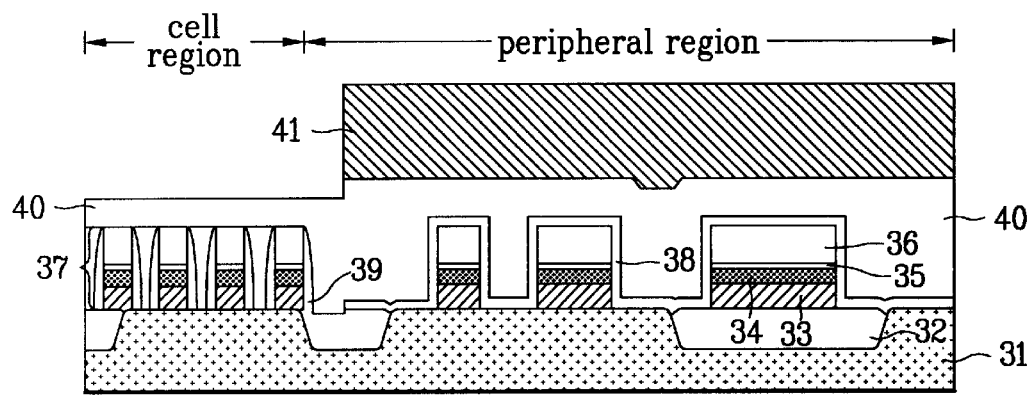

As shown in FIG. 2C, a second photoresist 41 is then deposited over the entire surface of the semiconductor substrate 31 and then selectively patterned by exposure and developing processes or other techniques to remain only over the semiconductor substrate 31 of the peripheral region.

Subsequently, the second polysilicon film 40 of the cell region is partially removed using the patterned second photoresist 41 as a mask. The second photoresist 41 is then removed. At this time, the top surface of the partially-removed second polysilicon film 40 of the cell region is positioned to be lower than the top surface of the second polysilicon film 40 of the peripheral region.

Figure 2D:
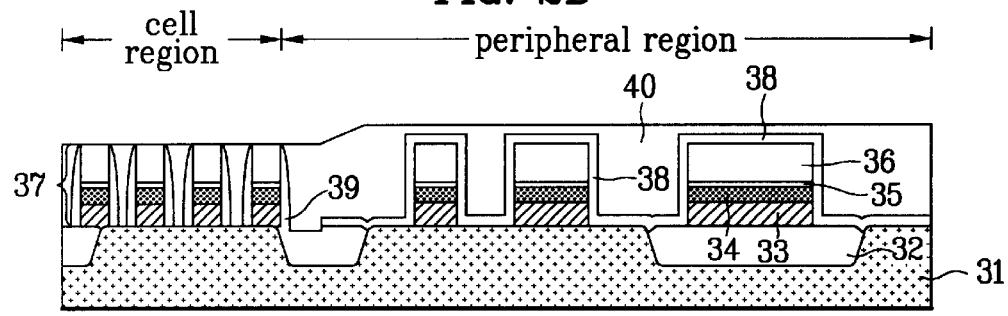

As shown in FIG. 2D, a CMP or other known process is performed on the entire surface of the resultant structure to remove selectively the second polysilicon film 40 of a predetermined thickness, so that an upper surface of the gates 37 in the cell region is exposed. At this time, since the second polysilicon film 40 over the gates 37 in the peripheral region has a larger thickness than the second polysilicon film 40 over the gates 37 in the cell region, the second polysilicon film 40 remains directly above the gates 37 in the peripheral region even after the CMP process. That is, the upper surface of the first oxide film 38 in the peripheral region is not exposed by the CMP process.

Figure 2E:
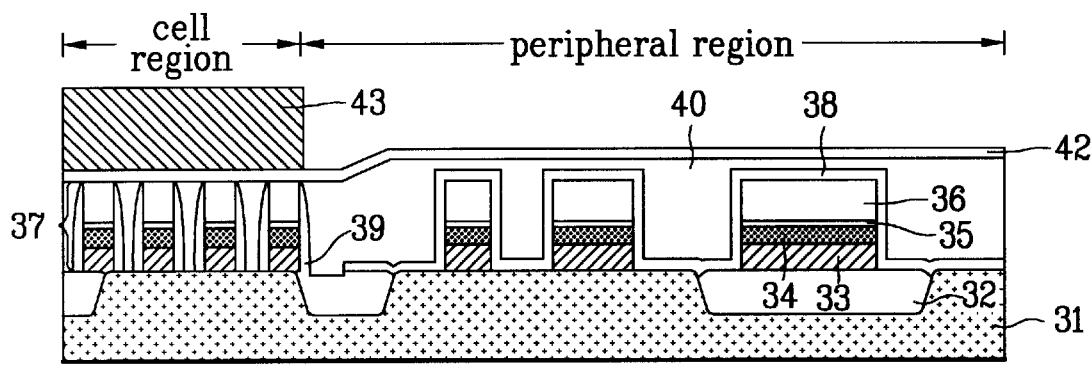

As shown in FIG. 2E, a second oxide film 42 is then deposited over the semiconductor substrate 31, and a third photoresist 43 is deposited over the entire surface of the semiconductor substrate 31. The third photoresist 43 is then patterned by the exposure and developing processes or other techniques to remain only over the semiconductor substrate 31 in the cell region.

Figure 2F:
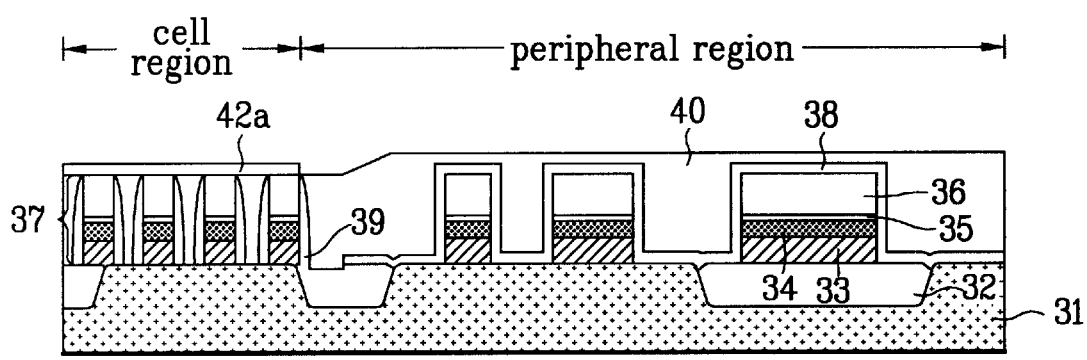

As shown in FIG. 2F, the second oxide film 42 is then selectively removed using the patterned third photoresist 43 as a mask to form a masking film 42a in the cell region. At this time, the cap oxide film 36 is not removed at all because the second polysilicon film 40 still remains over the gates 37 of the peripheral region and protects the cap oxide film 36 and the first oxide film 38. Therefore, exposure and oxidation of the tungsten film 34 in the peripheral region is prevented to improve significantly the operation of the semiconductor device.

Figure 2G:
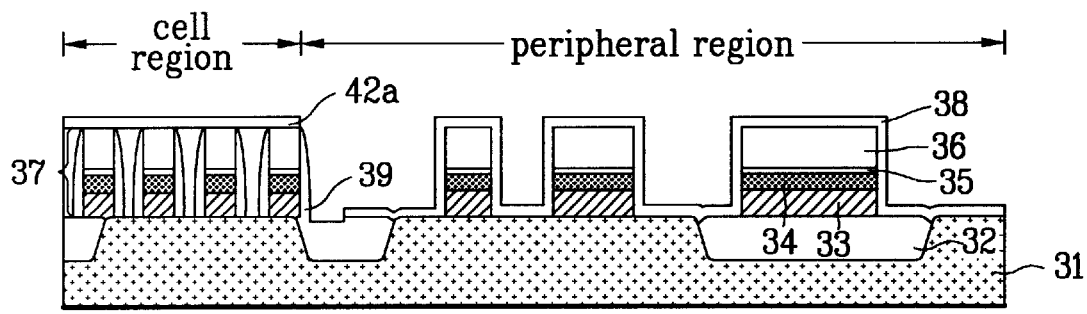

Finally, as shown in FIG. 2G, the second polysilicon film 40 in the peripheral region is removed using the masking film 42a as a mask. This completes the method of fabricating the semiconductor device according to the present invention.

As aforementioned, the method for fabricating a semiconductor device according to the embodiments of the present invention has many advantages including the following:

Since the polysilicon film (40) remains over the gates in the peripheral region, it is possible to prevent the metal portions of the gates in the peripheral region from being exposed and oxidized during the etching process, thereby reducing the resistivity of the gates. This improves the operational speed and reliability of the semiconductor device. Furthermore, since it is possible to prevent the gates from being oxidized, manufacture of a poorly configured or defective semiconductor device due to the oxidation of the gates can be avoided, thereby improving the yield of the semiconductor device.

The foregoing embodiments and advantages are merely exemplary and are not to be construed as limiting the present invention. The present teaching can be readily applied to other types of apparatuses, materials, and systems. The description of the present invention is intended to be illustrative, and not to limit the scope of the claims. Many alternatives, modifications and variations will be apparent to those skilled in the art. In the claims, means-plus-function clauses are intended to cover the structures described herein as performing the recited functions and not only structural equivalents but also equivalent structures.

What is claimed is:

1. A method of fabricating a semiconductor device, comprising the steps of:
   forming gates in a cell region and in a peripheral region of a substrate;
   forming a polysilicon layer over an entire surface of the resultant structure;
   partially removing portions of the polysilicon layer in the cell region to maintain the polysilicon layer of a predetermined thickness in the cell region;
   removing the predetermined thickness of the polysilicon layer both in the cell and peripheral regions, so that the resultant structure includes exposed gates in the cell region but no exposed gates in the peripheral region; and
   forming an insulating layer over the resultant structure.

2. The method of claim 1, wherein the step of removing the predetermined thickness of the polysilicon layer both in the cell and peripheral regions is performed by using a single etching process.

3. The method of claim 2, wherein the etching process is a chemical mechanical polishing process.

4. The method of claim 1, wherein, after the step of forming the insulating layer, the polysilicon layer is formed above the gates in the peripheral region.

5. The method of claim 1, further comprising the steps of:
   removing the insulating layer in the peripheral region to form a mask; and
   removing the polysilicon layer from the peripheral region using the mask.

6. The method of claim 1, wherein the step of forming the gates includes the steps of:
   forming a gate oxide film on the semiconductor substrate;
   sequentially forming a second polysilicon film, a metal film, a silicon nitride film, and a cap oxide film over the semiconductor substrate; and
   selectively removing the cap oxide film, the silicon nitride film, the metal film, and the second polysilicon film by etching processes.

7. The method of claim 1, wherein, after the partially removing step, a top surface of the polysilicon layer in the cell region is positioned lower than a top surface of the polysilicon layer in the peripheral region.

8. The method of claim 1, wherein the insulating layer is formed of an oxide film.

9. The method of claim 1, wherein, in the step of forming the polysilicon layer, a pattern density of the gates in the cell region is higher than a pattern density of the gates in the peripheral region.

10. A method of fabricating a semiconductor device, comprising the steps of:
    forming a plurality of stack gates on a semiconductor substrate in a cell region and a peripheral region;
    forming a first insulating film over the semiconductor substrate;
    selectively removing the first insulating film formed in the cell region to form insulating film spacers at sides of the gates formed in the cell region;
    forming a polysilicon film over an entire surface of the semiconductor substrate;
    partially removing the polysilicon film formed in the cell region by a removal process using a mask for exposing the cell region, so that a top surface of the polysilicon film in the cell region is positioned lower than a top surface of the polysilicon film formed in the peripheral region;
    exposing a surface of the gates formed in the cell region by performing a planarizing process on an entire surface of the resultant structure in the cell and peripheral regions;
    forming a masking film over the semiconductor substrate of the cell region; and
    removing the polysilicon film of the peripheral region using the masking film as a mask.

11. The method of claim 10, wherein the step of forming the gates includes the steps of:
    forming a gate oxide film on the semiconductor substrate;
    sequentially forming a second polysilicon film, a metal film, a silicon nitride film, and a cap oxide film over the semiconductor substrate; and selectively removing the cap oxide film, the silicon nitride film, the metal film, and the second polysilicon film by etching processes.

12. The method of claim 10, wherein the gates have a higher pattern density in the cell region than in the peripheral region.

13. The method of claim 10, wherein the first insulating film is formed of an oxide film.

14. The method of claim 10, wherein the step of selectively removing the first insulating film includes the steps of:
   depositing a photoresist over an entire surface of the semiconductor substrate after forming the first insulating film over the semiconductor substrate;
   patterning the photoresist to remain in the peripheral region; and
   selectively removing the first insulating film of the cell region using the patterned photoresist as a mask to form the insulating film spacers.

15. The method of claim 10, wherein, after the exposing step, the polysilicon film in the peripheral region has a thickness that covers an upper surface of the gates in the peripheral region.

16. The method of claim 10, wherein, in the exposing step, the planarizing process is performed in such a manner that an upper surface of the gates formed in the cell region is exposed and the polysilicon film remains over the gates formed in the peripheral region.

17. The method of claim 10, wherein the masking film is formed by depositing a second insulating film over an entire surface of the semiconductor substrate and selectively removing the second insulating film to remain only in the cell region.

18. The method of claim 17, wherein the second insulating film is formed of an oxide film.

19. The method of claim 10, wherein, after the step of forming the polysilicon layer but before the partially removing step, a top surface of the polysilicon layer in the cell region is positioned higher than a top surface of the polysilicon layer in the peripheral region.

* * * * *